United States Patent
Kimura et al.

(10) Patent No.: US 9,059,375 B2
(45) Date of Patent: Jun. 16, 2015

(54) SEMICONDUCTOR LIGHT EMITTING DEVICE AND METHOD FOR MANUFACTURING THE SAME

(71) Applicant: Kabushiki Kaisha Toshiba, Minato-ku (JP)

(72) Inventors: Shigeya Kimura, Yokohama (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/447,876

(22) Filed: Jul. 31, 2014

(65) Prior Publication Data

US 2015/0076448 A1 Mar. 19, 2015

(30) Foreign Application Priority Data

Sep. 19, 2013 (JP) .................................. 2013-194321

(51) Int. Cl.
*H01L 29/06* (2006.01)
*H01L 33/32* (2010.01)
(Continued)

(52) U.S. Cl.
CPC ................ *H01L 33/32* (2013.01); *H01L 33/06* (2013.01); *H01L 33/12* (2013.01); *H01L 29/7783* (2013.01); *H01L 29/15* (2013.01); *H01L 29/2003* (2013.01)

(58) Field of Classification Search
CPC . H01L 29/15; H01L 29/2003; H01L 21/0254; H01L 29/7783
USPC .................................................. 257/98, 13
See application file for complete search history.

(56) References Cited

U.S. PATENT DOCUMENTS 8,379,684 B1 * 2/2013 Bhat et al. .................. 372/46.01
2007/0297474 A1 * 12/2007 Sakong et al. ............. 372/43.01
(Continued)

FOREIGN PATENT DOCUMENTS

EP 2365540 A2 9/2011
JP 2001-308464 11/2001
(Continued)

OTHER PUBLICATIONS

Search Report issued Jan. 30, 2015 in European Patent Application No. 14179354.7 (in English).
(Continued)

*Primary Examiner* — Bilkis Jahan
(74) *Attorney, Agent, or Firm* — Oblon, McClelland, Maier & Neustadt, L.L.P.

(57) ABSTRACT

According to one embodiment, a semiconductor light emitting device includes first and second semiconductor layers, and a light emitting unit. The light emitting unit is provided between the first and second semiconductor layers and includes well layers and barrier layers. The barrier layers include p-side and n-side barrier layers, and a first intermediate barrier layer. The n-side barrier layer is provided between the p-side barrier layer and the first semiconductor layer. The first intermediate barrier layer is provided between the barrier layers. The well layers include p-side and n-side well layers, and a first intermediate well layer. The p-side well layer is provided between the p-side barrier layer and the second semiconductor layer. The n-side well layer is provided between the n-side barrier layer and the first intermediate barrier layer. The first intermediate well layer is provided between the first intermediate barrier layer and the p-side barrier layer.

20 Claims, 7 Drawing Sheets

(51) Int. Cl.
    *H01L 33/06*     (2010.01)
    *H01L 33/12*     (2010.01)
    *H01L 29/15*     (2006.01)
    *H01L 29/778*     (2006.01)
    *H01L 29/20*     (2006.01)

(56) References Cited

U.S. PATENT DOCUMENTS

| | | | |
|---|---|---|---|
| 2011/0089399 A1* | 4/2011 | Chakraborty et al. | 257/13 |
| 2011/0204394 A1* | 8/2011 | Hikosaka et al. | 257/94 |
| 2011/0243172 A1* | 10/2011 | Lin et al. | 372/45.012 |
| 2012/0049155 A1 | 3/2012 | Tachibana et al. | |
| 2012/0056156 A1 | 3/2012 | Kikuchi et al. | |
| 2012/0104360 A1* | 5/2012 | Hardy et al. | 257/18 |
| 2012/0119240 A1 | 5/2012 | Kyono et al. | |
| 2012/0286284 A1* | 11/2012 | Tachibana et al. | 257/76 |

FOREIGN PATENT DOCUMENTS

| | | |
|---|---|---|
| JP | 2010-263163 | 11/2010 |
| JP | 2011-96893 | 5/2011 |
| JP | 2012-244154 | 12/2012 |
| JP | 2012-256685 | 12/2012 |

OTHER PUBLICATIONS

J. Tersoff, et al.; "Competing Relaxation Mechanisms in Strained Layers"; May 30, 1994; vol. 72, No. 22; The American Physical Society; pp. 3570-3574.

* cited by examiner

SEMICONDUCTOR LIGHT EMITTING DEVICE AND METHOD FOR MANUFACTURING THE SAME

CROSS-REFERENCE TO RELATED APPLICATIONS

This application is based upon and claims the benefit of priority from Japanese Patent Application No. 2013-194321, filed on Sep. 19, 2013; the entire contents of which are incorporated herein by reference.

FIELD

Embodiments described herein relate generally to a semiconductor light emitting device and a method for manufacturing the same.

BACKGROUND

Group III-V nitride compound semiconductors such as gallium nitride (GaN) and the like are being applied to semiconductor light emitting devices such as light emitting diodes (LEDs), laser diodes (LDs), etc. It is desirable to increase the efficiency of such semiconductor light emitting devices.

DETAILED DESCRIPTION

Figure 1A:
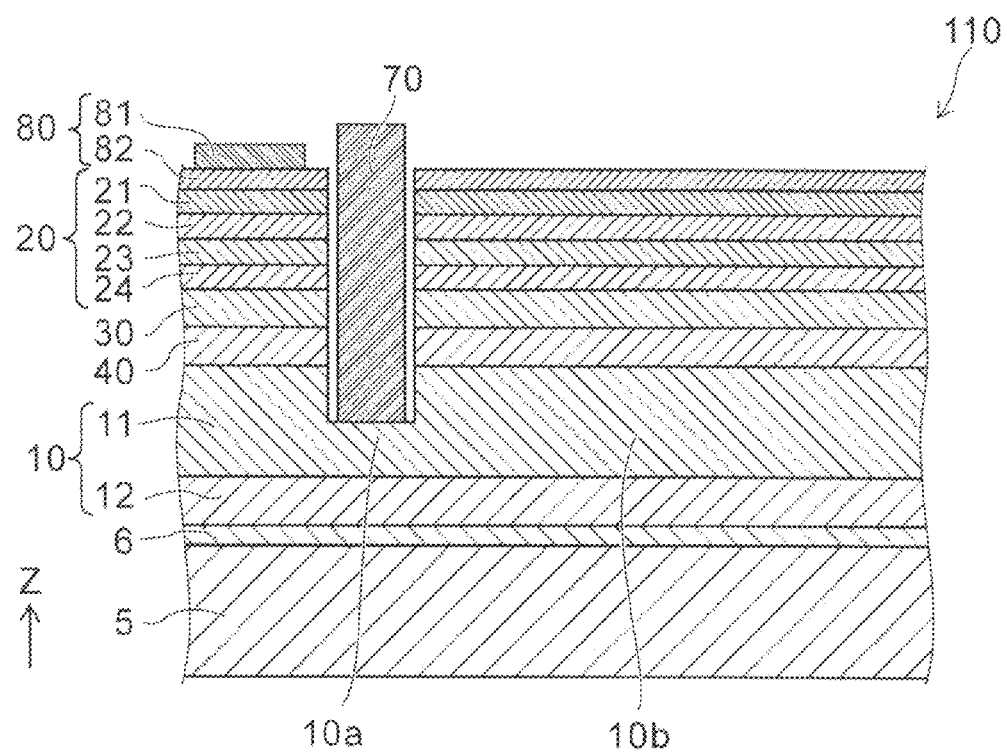
FIG. 1A and FIG. 1B are schematic cross-sectional views illustrating a semiconductor light emitting device according to a first embodiment.

According to one embodiment, a semiconductor light emitting device includes a first semiconductor layer, a second semiconductor layer, and a light emitting unit. The first semiconductor layer includes a nitride semiconductor. The first semiconductor layer is of an n-type. The second semiconductor layer includes a nitride semiconductor. The second semiconductor layer is of a p-type. The light emitting unit is provided between the first semiconductor layer and the second semiconductor layer. The light emitting unit includes a plurality of barrier layers and a plurality of well layers stacked alternately with the barrier layers. The barrier layers include a p-side barrier layer, an n-side barrier layer, and a first intermediate barrier layer. The p-side barrier layer is second most proximal to the second semiconductor layer among the barrier layers. The n-side barrier layer is provided between the p-side barrier layer and the first semiconductor layer. The first intermediate barrier layer is provided between the n-side barrier layer and the p-side barrier layer. The well layers include a p-side well layer, an n-side well layer, and a first intermediate well layer. The p-side well layer is provided between the p-side barrier layer and the second semiconductor layer. The p-side well layer is in contact with the p-side barrier layer. The n-side well layer is provided between the n-side barrier layer and the first intermediate barrier layer. The n-side well layer is in contact with the n-side barrier layer. The first intermediate well layer is provided between the first intermediate barrier layer and the p-side barrier layer. The first intermediate well layer is in contact with the first intermediate barrier layer. A first density of first misfit dislocations is higher than a second density of second misfit dislocations. The first misfit dislocations are included in the first intermediate barrier layer and in an interface between the first intermediate barrier layer and the first intermediate well layer. The second misfit dislocations are included in the p-side barrier layer and in an interface between the p-side barrier layer and the p-side well layer.

According to one embodiment, a method for manufacturing a semiconductor light emitting device is provided. The method includes forming a first semiconductor layer including a nitride semiconductor. The first semiconductor layer is of an n-type. The method includes forming a light emitting unit including a plurality of well layers and a plurality of barrier layers on the first semiconductor layer by alternately stacking the well layers and the barrier layers. The method includes forming a second semiconductor layer on the light emitting unit. The second semiconductor layer including a nitride semiconductor and is of a p-type. The forming of the light emitting unit including: forming an n-side barrier layer on the first semiconductor layer, the n-side barrier layer being included in the plurality of barrier layers; forming an n-side well layer on the n-side barrier layer, the n-side well layer being included in the well layers and being in contact with the n-side barrier layer; forming a first intermediate barrier layer on the n-side well layer, the first intermediate barrier layer being included in the barrier layers; forming a first intermediate well layer on the first intermediate barrier layer, the first intermediate well layer being included in the well layers and being in contact with the first intermediate barrier layer; forming a p-side barrier layer on the first intermediate well layer, the p-side barrier layer being included in the barrier layers; and forming a p-side well layer on the p-side barrier layer, the p-side well layer being included in the well layers and being in contact with the p-side barrier layer. A first density of first misfit dislocations is higher than a second density of second misfit dislocations. The first misfit dislocations are included in the first intermediate barrier layer and in an interface between the first intermediate barrier layer and the first intermediate well layer. The second misfit dislocations are included in the p-side barrier layer and in an interface between the p-side barrier layer and the p-side well layer.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
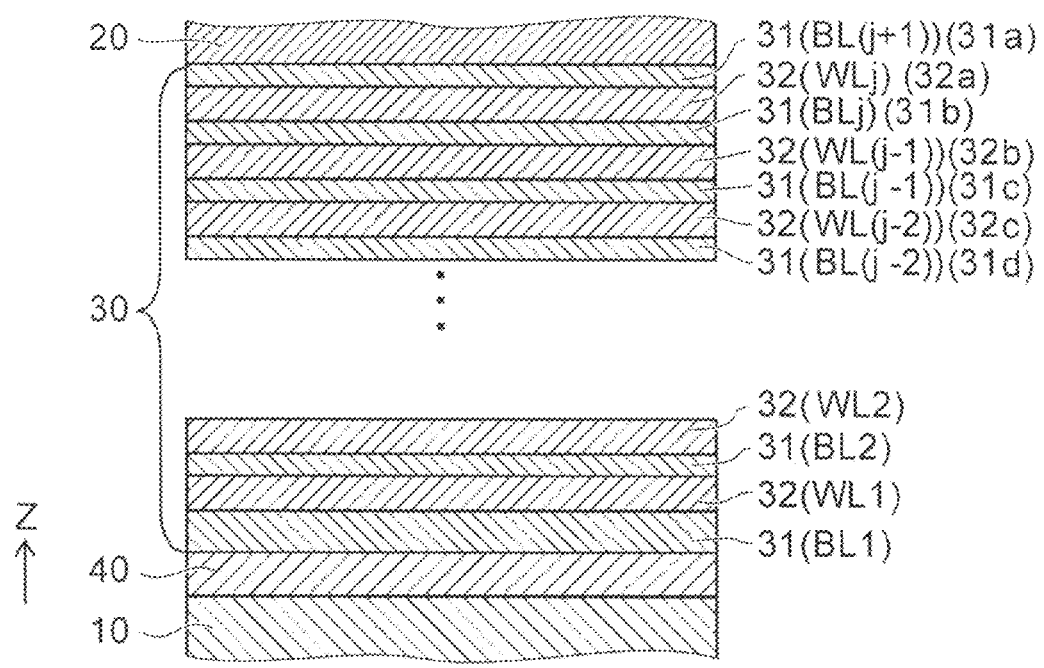

FIG. 1A and FIG. 1B are schematic cross-sectional views illustrating a semiconductor light emitting device according to a first embodiment.

FIG. 1B illustrates a portion of FIG. 1A.

As shown in FIG. 1A, the semiconductor light emitting device 110 according to the embodiment includes a first semiconductor layer 10, a second semiconductor layer 20, and a light emitting unit 30. The light emitting unit 30 is provided between the first semiconductor layer 10 and the second semiconductor layer 20. The first semiconductor layer 10 includes a nitride semiconductor. The conductivity type of the first semiconductor layer 10 is an n-type. The second semiconductor layer 20 includes a nitride semiconductor. The conductivity type of the second semiconductor layer 20 is a p-type.

In the example, a buffer layer 6 is provided on a substrate 5; and the first semiconductor layer 10, a multilayered structural body 40, the light emitting unit 30, and the second semiconductor layer 20 are provided on the buffer layer 6.

The substrate 5 includes, for example, Si. The substrate may include, for example, a substrate of GaN, SiC, ZnO, etc.

The buffer layer 6 includes, for example, at least one selected from an AlN layer, an AlGaN layer, and a GaN layer or a stacked film including these layers.

The first semiconductor layer 10 includes, for example, an n-type impurity. For example, Si is used as the n-type impurity. For example, Ge, Sn, etc., may be used as the n-type impurity.

In the example, the first semiconductor layer 10 includes a first n-side layer 11 and a second n-side layer 12. The first n-side layer 11 is disposed between the second n-side layer 12 and the light emitting unit 30 (in the example, between the second n-side layer 12 and the multilayered structural body 40).

The first n-side layer 11 is, for example, an n-side contact layer. The first n-side layer 11 includes, for example, n-type GaN. The second n-side layer 12 includes GaN. The impurity concentration of the first n-side layer 11 is higher than the impurity concentration of the second n-side layer 12.

The second semiconductor layer 20 includes, for example, a p-type impurity. For example, Mg is used as the p-type impurity. For example, Zn, etc., may be used as the p-type impurity.

In the example, the second semiconductor layer 20 includes a first p-side layer 21, a second p-side layer 22, a third p-side layer 23, and a fourth p-side layer 24. The second p-side layer 22 is provided between the first p-side layer 21 and the light emitting unit 30. The third p-side layer 23 is provided between the second p-side layer 22 and the light emitting unit 30. The fourth p-side layer 24 is provided between the third p-side layer 23 and the light emitting unit 30.

The first p-side layer 21 is, for example, a p-side contact layer. The first p-side layer 21 includes p-type GaN having a high impurity concentration. The second p-side layer 22 includes p-type GaN. The impurity concentration of the first p-side layer 21 is higher than the impurity concentration of the second p-side layer 22. The third p-side layer 23 includes, for example, p-type AlGaN. The third p-side layer 23 functions as, for example, an electron overflow suppression layer. The fourth p-side layer 24 includes, for example, AlGaN.

A direction from the first semiconductor layer 10 toward the second semiconductor layer 20 is taken as a Z-axis direction (a stacking direction).

The multilayered structural body 40 includes multiple first layers (not shown) stacked with multiple second layers (not shown). The first layers are stacked with the second layers along the Z-axis direction. The first layer includes, for example, GaN; and the second layer includes, for example, InGaN. The multilayered structural body 40 is, for example, a superlattice layer. The multilayered structural body 40 is provided as necessary and may be omitted.

A first electrode 70 and a second electrode 80 are further provided in the example. The first electrode 70 is electrically connected to the first semiconductor layer 10. The second electrode 80 is electrically connected to the second semiconductor layer 20.

In the example, a trench is made in the second semiconductor layer 20, the light emitting unit 30, and the multilayered structural body 40; and the first electrode 70 is connected to the first n-side layer 11 at the bottom surface of the trench. In other words, the first semiconductor layer 10 (the first n-side layer 11) includes a first portion 10a and a second portion 10b. The second portion 10b is arranged with the first portion 10a in a plane intersecting the Z-axis direction (the stacking direction). The first electrode 70 is connected to the first portion 10a. The light emitting unit 30 is provided between the second portion 10b and the second semiconductor layer 20.

The first electrode 70 includes, for example, a stacked film of a Ti film/Pt film/Au film. The thickness of the Ti film is, for example, 0.05 μm. The thickness of the Pt film is, for example, 0.05 μm. The thickness of the Au film is, for example, 1.0 μm.

In the example, the second electrode 80 includes a first conductive unit 81 and a second conductive unit 82. The second conductive unit 82 is provided between the first conductive unit 81 and the second semiconductor layer 20. The second conductive unit 82 contacts the second semiconductor layer 20. The second conductive unit 82 includes, for example, a conductive material that is light-transmissive. The second conductive unit 82 includes, for example, an oxide including at least one element selected from the group consisting of In, Sn, Zn, and Ti. The second conductive unit 82 includes, for example, ITO (Indium Tin Oxide), etc. The thickness of the second conductive unit 82 is, for example, 0.2 μm.

The first conductive unit 81 is electrically connected to the second conductive unit 82. The first conductive unit 81 is provided on a portion of the second conductive unit 82. The first conductive unit 81 includes, for example, a stacked film of a Ni film/Au film. The thickness of the Ni film is, for example, 0.05 μm. The thickness of the Au film is, for example, 1.0 μm.

A current flows in the light emitting unit 30 via the first semiconductor layer 10 and the second semiconductor layer 20 by applying a voltage between the first electrode 70 and the second electrode 80. Thereby, light is emitted from the light emitting unit 30. The peak wavelength of the emitted light is, for example, not less than 370 nanometers (nm) and not more than 650 nm. The semiconductor light emitting device 110 is, for example, an LED. The size of the semiconductor light emitting device 110 when viewed in plan (the size as viewed from the Z-direction) is, for example, not less than 300 μm and not more than 2000 μm long and not less than 300 μm and not more than 2000 μm wide.

In the example, the light that is emitted from the light emitting unit 30 is emitted to the outside mainly from the second semiconductor layer 20 side (the second electrode 80 side). In other words, the second semiconductor layer 20 side is used as the light emitting surface.

For example, the light that is emitted from the light emitting unit 30 may be emitted to the outside mainly from the first semiconductor layer 10 side. In other words, the first semiconductor layer 10 side may be used as the light emitting surface.

For example, the buffer layer 6, the first semiconductor layer 10, the multilayered structural body 40, the light emitting unit 30, and the second semiconductor layer 20 are formed on the substrate 5. The formation is performed by epitaxial growth. The epitaxial growth is performed by, for example, metal organic chemical vapor deposition (MOCVD), molecular beam epitaxy (MBE), hydride vapor phase epitaxy (HVPE), etc. The substrate 5 may be removed after the formation of these layers.

As shown in FIG. 1B, the light emitting unit 30 includes multiple well layers 32 stacked alternately with multiple barrier layers 31. The multiple well layers 32 and the multiple barrier layers 31 are disposed alternately along the Z-axis direction (the stacking direction). The light emitting unit 30 has a multiple quantum well (MQW) configuration.

The bandgap energy of the well layers 32 is less than the bandgap energy of the multiple barrier layers 31. The thickness of the well layer 32 is, for example, thicker than the thickness of the barrier layer 31. The thickness of the well layer 32 is, for example, not less than 2 nm and not more than 6 nm. The thickness of the barrier layer 31 is, for example, not less than 2 nm and not more than 10 nm.

The well layers 32 include, for example, $In_wGa_{1-w}N$ (0<w<1). The barrier layers 31 include, for example, $In_bGa_{1-b}N$ (0≤b<1 and b<w). The well layers 32 include, for example, InGaN. The barrier layers 31 include, for example, GaN. For example, the barrier layers 31 substantially do not include In. In the case where the barrier layers 31 include In, the In composition ratio of the barrier layers 31 is lower than the In composition ratio of the well layers 32.

For example, the light emitting unit 30 includes j+1 barrier layers 31 and j well layers 32 (j being an integer not less than 3). The (i+1)th barrier layer BL(i+1) is disposed between the ith barrier layer BLi and the second semiconductor layer 20 (i being an integer not less than 1 and not more than j−1). The (i+1)th well layer WL(i+1) is disposed between the ith well layer WLi and the second semiconductor layer 20. The first barrier layer BL1 is provided between the first semiconductor layer 10 and the first well layer WL1. The jth well layer WLj is provided between the jth barrier layer BLj and the (j+1)th barrier layer BL(j+1). The (j+1)th barrier layer BL(j+1) is provided between the jth well layer WLj and the second semiconductor layer 20.

As shown in FIG. 1B, the multiple well layers 32 include a first p-side well layer 32a and a second p-side well layer 32b. Among the multiple well layers 32, the first p-side well layer 32a is most proximal to the second semiconductor layer 20. Among the multiple well layers 32, the second p-side well layer 32b is second most proximal to the second semiconductor layer 20. The multiple well layers 32 may further include a third p-side well layer 32c. Among the multiple well layers 32, the third p-side well layer 32c is third most proximal to the second semiconductor layer 20.

The first p-side well layer 32a corresponds to the jth well layer WLj. The second p-side well layer 32b corresponds to the (j−1)th well layer WL(j−1). The third p-side well layer 32c corresponds to the (j−2)th well layer WL(j−2). The first well layer WL1 is jth most proximal to the second semiconductor layer 20. Among the multiple well layers 32, the first well layer WL1 is most proximal to the first semiconductor layer 10. The first well layer WL1 corresponds to, for example, an n-side well layer 32n.

As shown in FIG. 1B, the multiple barrier layers 31 include a first p-side barrier layer 31a and a second p-side barrier layer 31b. Among the multiple barrier layers 31, the first p-side barrier layer 31a is most proximal to the second semiconductor layer 20. Among the multiple barrier layers 31, the second p-side barrier layer 31b is second most proximal to the second semiconductor layer 20. The multiple barrier layers 31 further include a third p-side barrier layer 31c and a fourth p-side barrier layer 31d. Among the multiple barrier layers 31, the third p-side barrier layer 31c is third most proximal to the second semiconductor layer 20. Among the multiple barrier layers 31, the fourth p-side barrier layer 31d is fourth most proximal to the second semiconductor layer 20.

The first p-side barrier layer 31a corresponds to the (j+1)th barrier layer BL(j+1). The second p-side barrier layer 31b corresponds to the (j)th barrier layer BL(j). The third p-side barrier layer 31c corresponds to the (j−1)th barrier layer BL(j−1). The fourth p-side barrier layer 31d corresponds to the (j−2)th barrier layer BL(j−2). The (j+1)th barrier layer BL(j+1) is most proximal to the second semiconductor layer 20. Among the multiple barrier layers 31, the first barrier layer BL1 is most proximal to the first semiconductor layer 10. The first barrier layer BL1 corresponds to, for example, an n-side barrier layer 31n.

Among the multiple barrier layers 31 in the embodiment, at least one layer selected from the second to (j−1)th barrier layers BL2 to BL(j−1) is set to be a designated barrier layer BL(k). Here, k is an integer that satisfies 2≤k≤(j−1). Then, misfit dislocations are caused to exist concentratively in the designated barrier layer BL(k) and in the interface between the designated barrier layer BL(k) and the well layer on the second semiconductor layer 20 side of the designated barrier layer BL(k).

In the embodiment, a first density is the density of the misfit dislocations included in the designated barrier layer BL(k) and in the interface between the designated barrier layer BL(k) and the well layer on the second semiconductor layer 20 side of the designated barrier layer BL(k). A second density is the density of the misfit dislocations included in the (j)th barrier layer BL(j) and in the interface between the (j)th barrier layer BL(j) and the well layer on the second semiconductor layer 20 side of the (j)th barrier layer BL(j). In the embodiment, the first density is higher than the second density. The first density is, for example, not less than 1.5 times the second density. Thereby, the semiconductor light emitting device 110 is provided in which the strain applied to the jth well layer WLj that actually emits light and is most proximal to the second semiconductor layer 20 and the strain applied to the vicinity of the jth well layer WLj are reduced; the crystallinity is maintained; and the luminous efficiency is high.

Thus, the multiple barrier layers 31 include the p-side barrier layer, the n-side barrier layer, and the first intermediate barrier layer. Among the multiple barrier layers 31, the p-side barrier layer is second most proximal to the second semiconductor layer 20. The n-side barrier layer is provided between the p-side barrier layer and the first semiconductor layer 10. The first intermediate barrier layer is provided between the p-side barrier layer and the first semiconductor layer 10.

The p-side barrier layer corresponds to the jth barrier layer BL(j) (i.e., the second p-side barrier layer 31b). The n-side barrier layer corresponds to, for example, one selected from the first to (j−2)th barrier layers BL1 to BL(j−2). The first intermediate barrier layer corresponds to any barrier layer provided between the n-side barrier layer and the p-side barrier layer. The first intermediate barrier layer corresponds to one of the designated barrier layers.

The multiple well layers 32 include the p-side well layer, the n-side well layer, and the first intermediate well layer. The p-side well layer is provided between the p-side barrier layer and the second semiconductor layer 20 in contact with the p-side barrier layer. The n-side well layer is provided between the n-side barrier layer and the first intermediate barrier layer in contact with the n-side barrier layer. The first intermediate barrier layer is provided between the first intermediate barrier layer and the p-side barrier layer in contact with the first intermediate barrier layer. The p-side well layer corresponds to the jth well layer WLj (i.e., the first p-side well layer 32a). The n-side well layer corresponds to the first well layer WL1.

The first density is the density of the first misfit dislocations included in the first intermediate barrier layer and in the interface between the first intermediate barrier layer and the first intermediate well layer. The second density is the density of the second misfit dislocations included in the p-side barrier layer and in the interface between the p-side barrier layer and the p-side well layer. In the embodiment, the first density is higher than the second density.

Figures 2A, 2B:
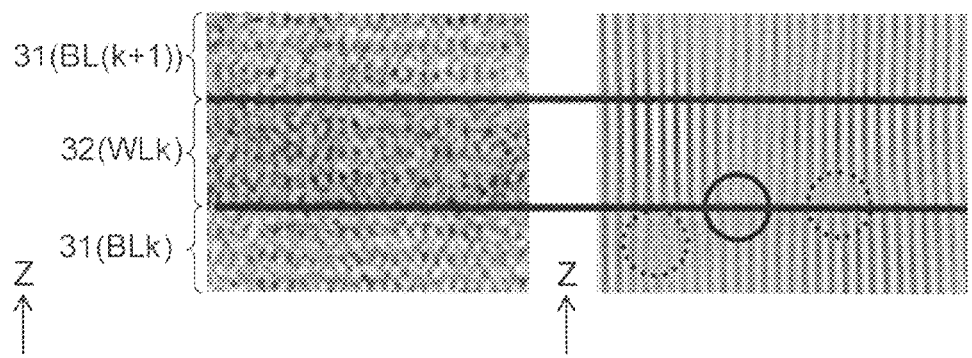
FIGS. 2A and 2B illustrate misfit dislocations.

FIGS. 2A and 2B illustrate misfit dislocations.

FIG. 2A shows a transmission electron microscope (TEM) image in which misfit dislocations actually are observed. FIG. 2B shows an analysis image of only the arrangement of the (0−1−10) lattice planes by performing a fast Fourier transform of the TEM lattice image shown in FIG. 2A and then performing an inverse Fourier transform.

The portions enclosed with the circles in FIG. 2B indicate regions where the arrangement of the lattice planes is discontinuous and a shift in the number of lattice planes has occurred inside a Burgers circuit. In FIG. 2B, the solid circle is a region where the number of lattice planes increases in the Z-direction; and the broken-line circle is a region where the number of lattice planes decreases in the Z-direction. Here, the dislocations and the defects include "misfit dislocations," "edge dislocations," "stacking faults," etc. In the case where such dislocations/defects exist in a designated region inside the light emitting unit 30, the coherence of the arrangement of the crystal in the region is lost; and the lattice constant in the region relaxes.

Misfit dislocations are described in, for example, "Physics of Crystal Defects," Koji Maeda and Shin Takeuchi, Shokabo Publishing Co., Jun. 20, 2011, pp. 195-199.

The size of a misfit dislocation is different from the size of a line defect such as an edge dislocation or a screw dislocation.

Figure 3:
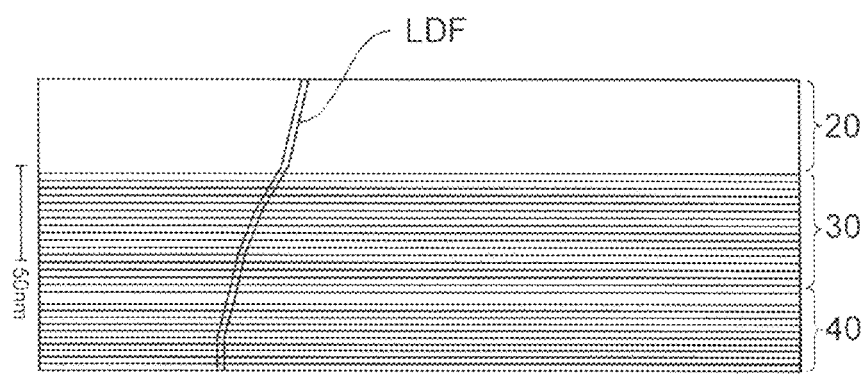
FIG. 3 is a schematic view illustrating a line defect.

FIG. 3 is a schematic view illustrating a line defect.

As shown in FIG. 3, the line defect LDF has a length exceeding 50 nm. On the other hand, the size of a misfit dislocation is, for example, small enough to fit inside each layer of the barrier layers 31 and/or the well layers 32.

The case where the number of well layers is eight (j=8) and the barrier layer BL(5) for which k=5 is set to be a designated barrier layer will now be described as an example.

Figure 4:
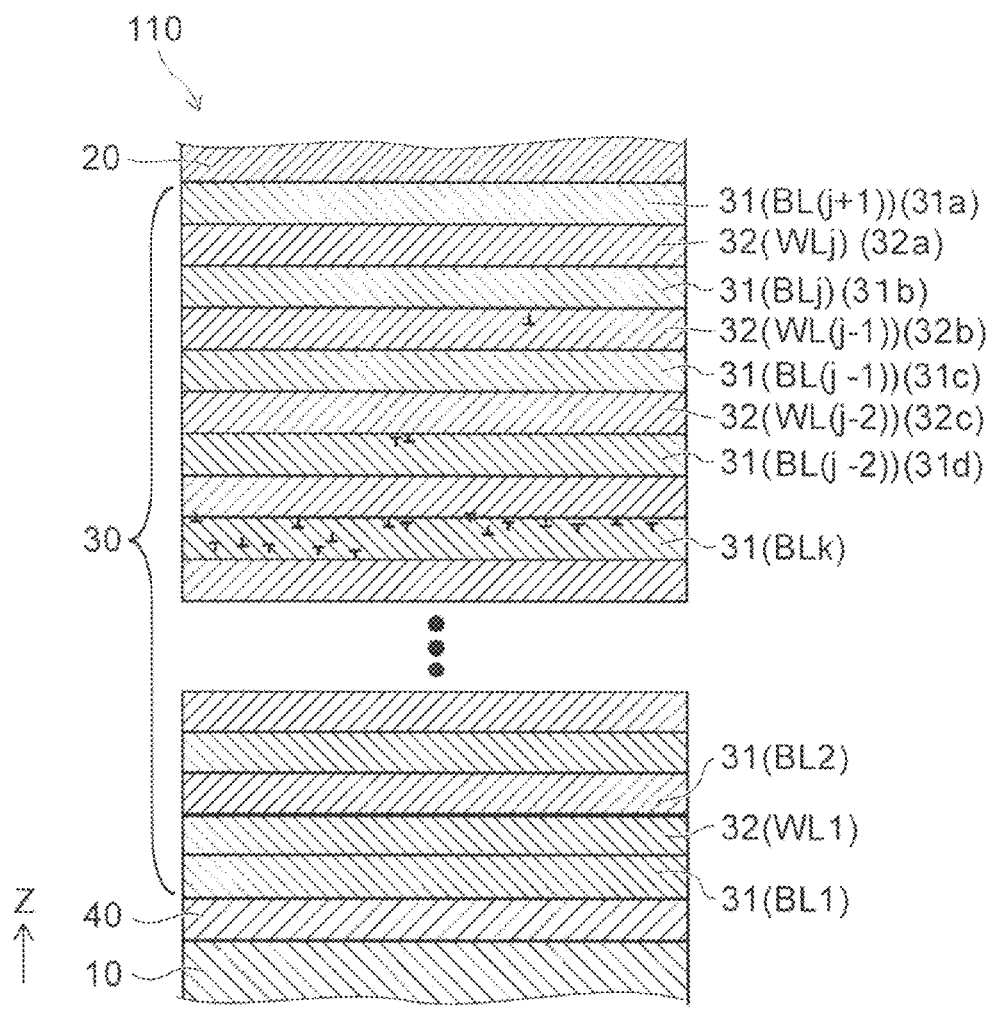
FIG. 4 is a schematic view illustrating the state of the misfit dislocations of the light emitting unit.

FIG. 4 is a schematic view illustrating the state of the misfit dislocations of the light emitting unit.

In FIG. 4, the misfit dislocations are illustrated by symbols having T-shapes and inverted T-shapes. The symbols having T-shapes shown in FIG. 4 are regions where the number of lattice planes decreases in the Z-direction; and the symbols having inverted T-shapes are regions where the number of lattice planes increases in the Z-direction. As shown in FIG. 4, in the example, the misfit dislocations are concentrated in the barrier layer BL(5).

FIG. 5A to FIG. 5E are schematic views illustrating a state of the light emitting unit.

Figure 5A:
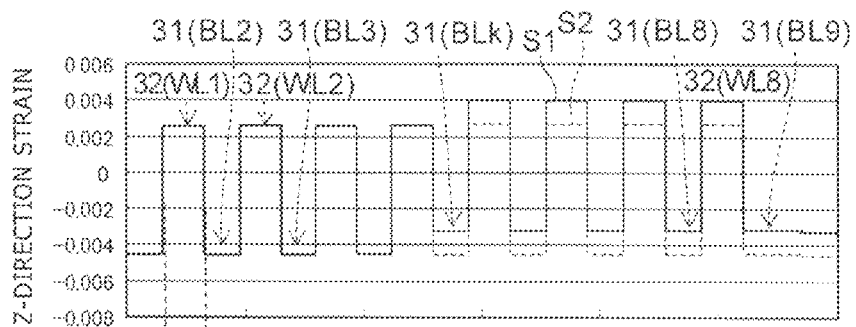
FIG. 5A to FIG. 5E are schematic views illustrating a state of the light emitting unit.

FIG. 5A shows the magnitude of the Z-direction strain of the light emitting unit. The vertical axis of FIG. 5A is the magnitude of the strain. A positive value of the strain indicates compressive stress; and negative indicates tensile stress. The horizontal axis of FIG. 5A is the position in Z-direction.

Figure 5B:
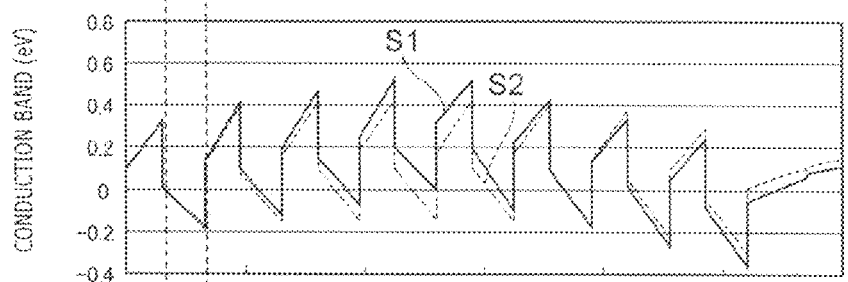
Figure 5C:
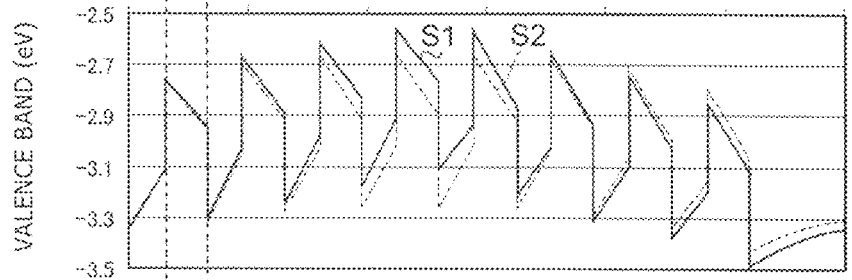

FIG. 5B shows the energy of the conduction band of the light emitting unit. FIG. 5C shows the energy of the valence band of the light emitting unit. In FIG. 5B and FIG. 5C, the vertical axis is the energy (eV); and the horizontal axis is the Z-direction position.

Figure 5D:
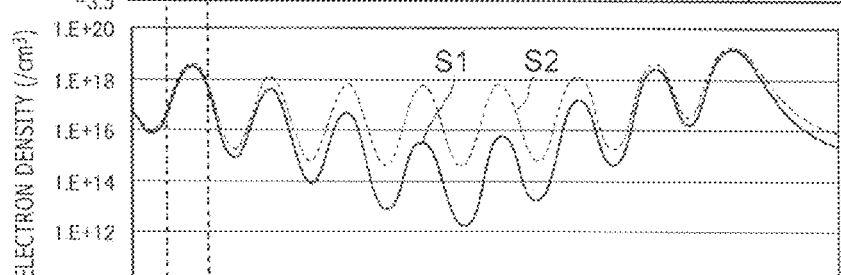
Figure 5E:
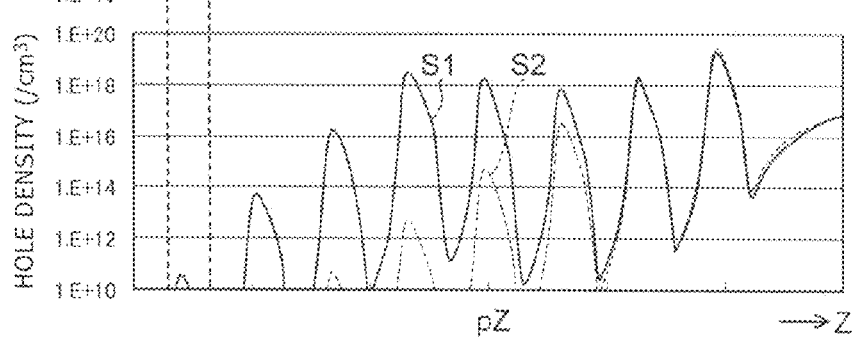

FIG. 5D shows the electron density of the light emitting unit. FIG. 5E shows the hole density of the light emitting unit. In FIG. 5D and FIG. 5E, the vertical axis is the density (/cm3); and the horizontal axis is the Z-direction position. FIG. 5B to FIG. 5E show the state in which an external electric field of 3.2 V is applied to the light emitting unit.

In each of FIG. 5A to FIG. 5E, solid line S1 illustrates the state in which the barrier layer BL(5) is set to be the designated barrier layer; and broken line S2 illustrates the state in which there is no designated barrier layer (the entire light emitting unit 30 is coherent).

As illustrated by solid line S1 of FIG. 5A, because the misfit dislocations are concentrated in the barrier layer BL(5), the strain is relaxed for the barrier layers BL(5) to BL(9) that include the barrier layer BL(5) and are on the second semiconductor layer 20 side of the barrier layer BL(5).

It can be seen from broken line S2 of FIG. 5E that the hole density of the well layer WL(8) (the first p-side well layer 32a) most proximal to the p-side is highest; and the hole density decreases exponentially toward the n-side in the well layers WL32(7), WL32(6), and so on. The segregation of the hole density toward the p-side well layer causes the efficiency of the semiconductor light emitting device to decrease.

Conversely, in the case where the barrier layer BL(5) is set to be the designated barrier layer as in the embodiment, as illustrated by solid line S1 of FIG. 5B and FIG. 5C, the conduction band and the valence band have protruding configurations above broken line S2 for the barrier layers around the barrier layer BL(5) for which the strain is partially relaxed.

Thereby, the movement of electrons toward the p-side is suppressed; and the movement of holes toward the n-side is promoted. Accordingly, as illustrated by solid line S1 of FIG. 5E, the holes also disperse toward the well layer WL(7) and/or the well layer WL(6).

In other words, by setting the barrier layer BL(5) to be the designated barrier layer as in the embodiment, the segregation of the hole density toward the p-side well layer is suppressed; and the effect of increasing the luminous efficiency is obtained. For the barrier layers BL(6) to BL(9) and the well layers WL(6) to WL(9) which are further on the p-layer side than is the partially-relaxed barrier layer BL(5), the arrangement of the crystal lattice is coherent; and the crystallinity is not lost. That is, there are few defects in the well layers WL(6) to WL(8) on the p-layer side where the semiconductor light emitting device actually emits light; and therefore, a high luminous efficiency can be maintained.

Although the case where lattice relaxation is performed for the barrier layer BL(5) for which k=5 is described as an example in regard to FIG. 5A to FIG. 5E, if $2 \leq k \leq (j-1)$ is satisfied, similar effects are obtained even in the case where lattice relaxation is performed using another barrier layer as the designated barrier layer. The number of relaxed barrier layers BL may be one or more. For example, lattice relaxation may be performed for multiple barrier layers satisfying $2 \leq k \leq (j-1)$ and being used as designated barrier layers.

For example, the multiple barrier layers 31 further include a second intermediate barrier layer. The second intermediate barrier layer is provided between the first intermediate barrier layer and the p-side barrier layer. For example, the second intermediate barrier layer is any barrier layer positioned between the first intermediate barrier layer and the p-side barrier layer. The multiple well layers 32 further include a second intermediate well layer. The second intermediate well layer is provided between the second intermediate barrier layer and the p-side barrier layer in contact with the second intermediate barrier layer. A third density is the density of the third misfit dislocations included in the second intermediate barrier layer and in the interface between the second intermediate barrier layer and the second intermediate well layer. The third density is higher than the second density.

To change the carrier density distribution by relaxing the lattice constant, the density of the misfit dislocations provided in the designated barrier layer BL(k) is set to be not less than $5 \times 10^{12}/cm^2$. More desirably, the density of the misfit dislocations is not less than $7 \times 10^{12}/cm^2$. On the other hand, the density of the misfit dislocations in the barrier layers for which the lattice constant is not relaxed is less than $2 \times 10^{12}/cm^2$, and more favorably less than $1 \times 10^{12}/cm^2$.

Methods for generating the misfit dislocations in the designated barrier layer BL(k) include, as described below, optimizing the layer structure and adjusting the growth conditions by doping the designated barrier layer BL(k) with an impurity such as indium (In), magnesium (Mg), silicon (Si), etc.

Second Embodiment

A method for manufacturing a semiconductor light emitting device according to a second embodiment will now be described.

Figure 6:
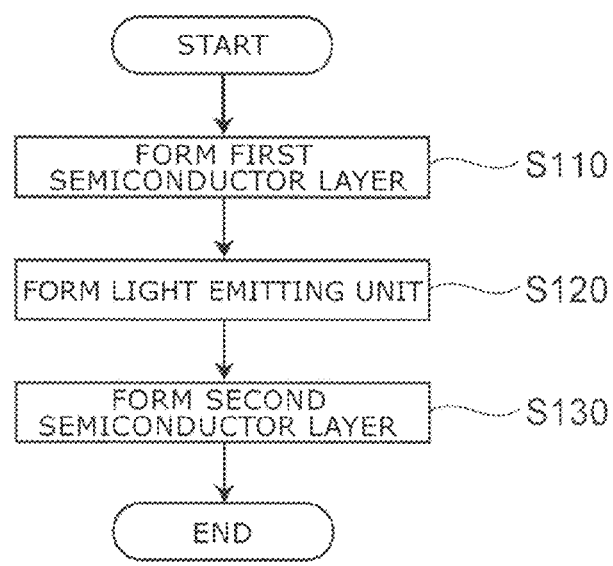
FIG. 6 is a flowchart illustrating the method for manufacturing the semiconductor light emitting device according to the second embodiment.

FIG. 6 is a flowchart illustrating the method for manufacturing the semiconductor light emitting device according to the second embodiment.

As shown in FIG. 6, the method for manufacturing the semiconductor light emitting device according to the embodiment includes a process of forming the first semiconductor layer 10 that includes a nitride semiconductor and is of the n-type (step S110).

The manufacturing method further includes a process of forming the light emitting unit 30 including the multiple well layers 32 and the multiple barrier layers 31 on the first semiconductor layer 10 by alternately stacking the multiple well layers 32 and the multiple barrier layers 31 (step S120).

The manufacturing method further includes a process of forming the second semiconductor layer 20 that includes a nitride semiconductor and is of the p-type on the light emitting unit 30 (step S130).

In the manufacturing method, the process of forming the light emitting unit 30 (step S120) includes setting the first density which is the density of the misfit dislocations included in the barrier layer BL(k) which is the designated barrier layer and in the interface between the barrier layer BL(k) and the well layer on the second semiconductor layer 20 side of the barrier layer BL(k) to be higher than the second density which is the density of the misfit dislocations included in the (j)th barrier layer BL(j) and in the interface between the (j)th barrier layer BL(j) and the well layer on the second semiconductor layer 20 side of the (j)th barrier layer BL(j).

Thus, the process of forming the light emitting unit 30 includes a process of forming, on the first semiconductor layer 10, the n-side barrier layer included in the multiple barrier layers 31, a process of forming, on the n-side barrier layer, an n-side well layer included in the multiple well layers 32 and in contact with the n-side barrier layer, a process of forming, on the n-side well layer, a first intermediate barrier layer included in the multiple barrier layers 31, a process of forming, on the first intermediate barrier layer, a first intermediate well layer included in the multiple well layers 32 and in contact with the first intermediate barrier layer, a process of forming, on the first intermediate well layer, a p-side barrier layer included in the multiple barrier layers 31, and a process of forming, on the p-side barrier layer, a p-side well layer included in the multiple well layers 32 and in contact with the p-side barrier layer. The first density of the first misfit dislocations included in the first intermediate barrier layer and in the interface between the first intermediate barrier layer and the first intermediate well layer is higher than the second density of the second misfit dislocations included in the p-side barrier layer and in the interface between the p-side barrier layer and the p-side well layer.

A specific an example of the method for manufacturing will now be described.

First, for example, the substrate 5 of Si (111) is introduced to the reactor of a MOCVD apparatus and heated to about 1070° C. on the susceptor of the reactor.

Then, a buffer layer 6 including Al and having a thickness of 1.2 μm is grown on the major surface of the substrate 5. Further, an undoped GaN layer that has a thickness of 4 μm and is used to form the second n-side layer 12 is grown on the buffer layer 6. Then, a Si-doped GaN layer that has a thickness of 1 μm and is used to form the first n-side layer 11 is grown on the second n-side layer 12.

Continuing, the multilayered structural body 40 is formed by alternately stacking a first layer and a second layer on the first n-side layer 11. The first layer includes $In_xGa_{1-x}N$ ($0 \leq x < 1$); and the second layer includes $In_yGa_{1-y}N$ ($0 < y < 1$ and $x < y$). The number (the period) of the stacks of the first layer and the second layer is, for example, 30.

Then, the light emitting unit 30 is formed on the multilayered structural body 40. In the example, 8 periods of the barrier layer 31 and the well layer 32 are stacked alternately. A GaN layer having a thickness of 3 nm is formed as the barrier layer 31. An InGaN layer having a thickness of 3.5 nm is formed as the well layer 32. The In composition ratio of the well layer 32 is 0.13. The In composition ratio is w of $In_wGa_{1-w}N$ ($0 < w < 1$).

Continuing, the fourth p-side layer 24, the third p-side layer 23, the second p-side layer 22, and the first p-side layer 21 are formed sequentially on the light emitting unit 30. An AlGaN layer having an Al composition ratio of 0.003 and a thickness of 5 nm is formed as the fourth p-side layer 24. A Mg-doped AlGaN layer having an Al composition ratio of 0.1 and a thickness of 10 nm is formed as the third p-side layer 23. A Mg-doped p-type GaN layer having a thickness of 80 nm is formed as the second p-side layer 22. The Mg concentration of the second p-side layer 22 is about $2 \times 10^{19}/cm^3$. A high-concentration Mg-doped GaN layer having a thickness of 10 nm is formed as the first p-side layer 21. The Mg concentration of the first p-side layer 21 is about $1 \times 10^{21}/cm^3$.

Subsequently, the substrate 5 on which the semiconductor stacked body recited above is grown is extracted from the reactor of the MOCVD apparatus.

Then, a portion of the semiconductor stacked body is removed by dry etching. Thereby, a portion of the first n-side layer 11 is exposed. The first electrode 70 of a Ti film/Pt film/Au film is formed on the first n-side layer 11 that is exposed. On the other hand, an ITO film that is used to form the second conductive unit 82 is formed on the first p-side layer 21. The first conductive unit 81 of a Ni film/Au film is formed on a portion of the second conductive unit 82. The planar pattern of the first conductive unit 81 is, for example, a circle having a diameter of 80 μm.

Thus, the semiconductor light emitting device 110 is formed. Although the simplest structure of the semiconductor light emitting device 110 is described, the light extraction efficiency is remarkably higher for a semiconductor light emitting device having, for example, a so-called thin film structure in which lift-off of only the substrate 5 is performed for the substrate 5 on which the semiconductor stacked body is grown, and a metal electrode and a support substrate are adhered to the first p-side layer 21 on the opposite side than for the light emitting device using ITO.

The dominant wavelength (the peak wavelength) of the light emitted from the semiconductor light emitting device 110 is about 450 nm. In other words, such semiconductor light emitting devices are LEDs that emit blue light.

FIG. 7A to FIG. 7F illustrate the density of the misfit dislocations.

Figure 7A:
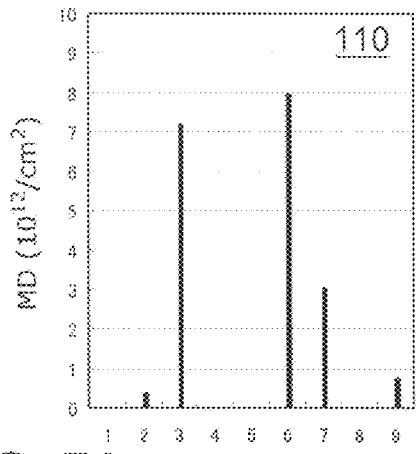
FIG. 7A to FIG. 7F illustrate the density of the misfit dislocations.
Figure 7B:
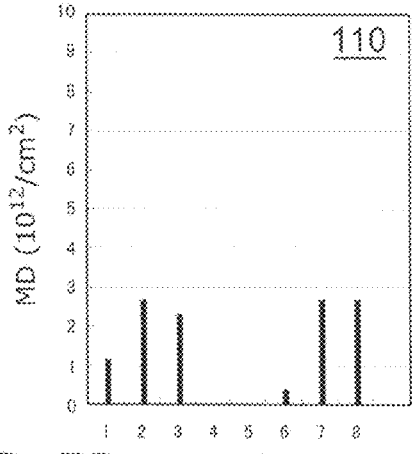
Figure 7C:
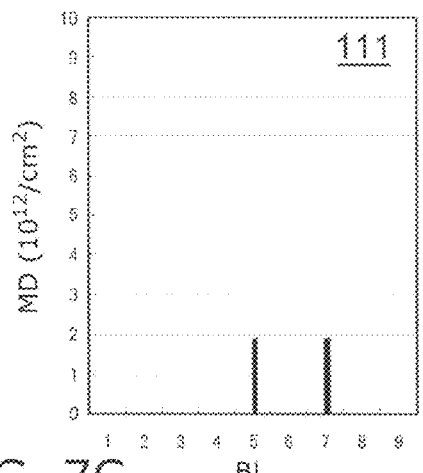
Figure 7D:
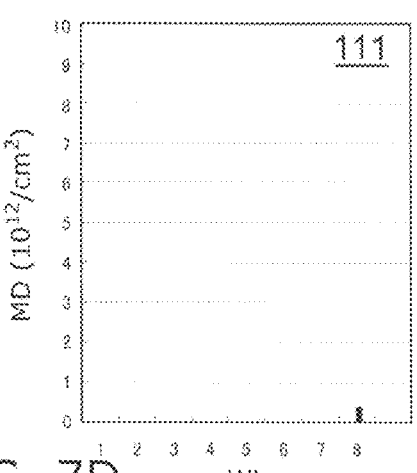
Figure 7E:
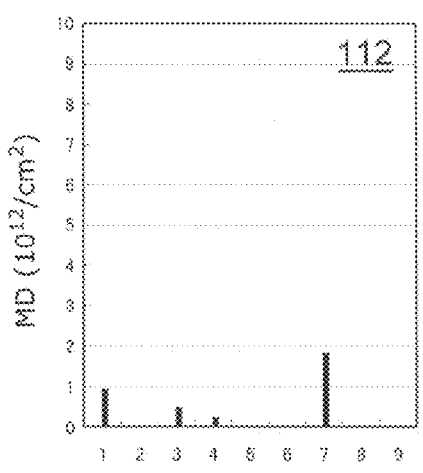
Figure 7F:
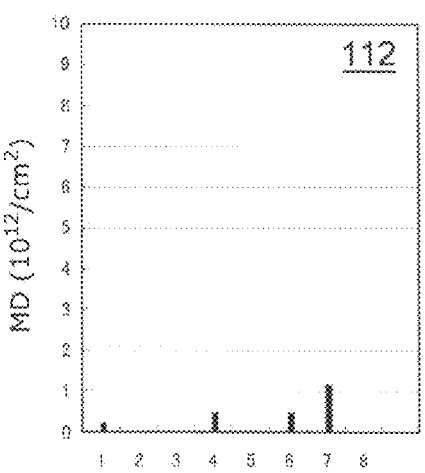

In FIG. 7A, FIG. 7C, and FIG. 7E, the horizontal axis is the layer number (1 to j+1) of the barrier layers; and in FIG. 7B, FIG. 7D, and FIG. 7F, the horizontal axis is the layer number (1 to j) of the well layers. In FIG. 7A to FIG. 7F, the vertical axis is the dislocation density MD ($10^2/cm^2$) of the misfit dislocations. In FIG. 7A to FIG. 7F, the case where j=8 is used as an example. The density of the misfit dislocations for each of the barrier layers BL(1) to BL(9) and each of the well layers WL(1) to WL(8) is determined from analysis images of the (0–1–10) lattice planes obtained by performing a fast Fourier transform of the image observed by TEM and than performing an inverse Fourier transform.

FIG. 7A shows the density of the misfit dislocations for the barrier layers of the semiconductor light emitting device 110 according to the embodiment. FIG. 7B shows the density of the misfit dislocations for the well layers of the semiconductor light emitting device 110 according to the embodiment. The semiconductor light emitting device 110 is manufactured by the manufacturing method described above. The thickness of the barrier layer 31 is 3.0 nm; and the thickness of the well layer 32 is 3.5 nm.

In the example, as shown in FIG. 7A, the misfit dislocations are concentrated in the barrier layer BL(3) which is the third barrier layer from the n-layer side and in the barrier layer BL(6) which is the sixth from the n-layer side; and the dislocation density MD is not less than $7×10^{12}/cm^2$ for only these layers. In the example, the barrier layers BL(3) and BL(6) are the designated barrier layers. On the other hand, it can be confirmed that the dislocation density MD is less than $1×10^{12}/cm^2$ and is remarkably low for the other barrier layers BL(1), BL(2), BL(4), BL(5), BL(8), and BL(7).

As shown in FIG. 7B, the density of the misfit dislocations is lower for the well layers WL(1) to WL(8) than for the designated barrier layers (e.g., the barrier layers BL(3) and BL(6)) shown in FIG. 7A. In other words, in the semiconductor light emitting device 110, the density of the misfit dislocations is higher for the designated barrier layers (e.g., the barrier layers BL(3) and BL(6)) than for the well layers WL(1) to WL(8).

FIG. 7C to FIG. 7F show the density of the misfit dislocations for semiconductor light emitting devices 111 and 112 according to a first reference example and a second reference example.

FIG. 7C shows the density of the misfit dislocations for the barrier layers of the semiconductor light emitting device 111 according to the first reference example. FIG. 7D shows the density of the misfit dislocations for the well layers of the semiconductor light emitting device 111 according to the first reference example. In the semiconductor light emitting device 111 according to the first reference example, the thickness of the barrier layer 31 is 3.0 nm; and the thickness of the well layer 32 is 2.5 nm. The semiconductor light emitting device 111 is manufactured by the manufacturing method described above in which the film thickness of the barrier layer 31 and the film thickness of the well layer 32 are modified. Otherwise, the manufacturing method is similar to the manufacturing method described above.

FIG. 7E shows the density of the misfit dislocations for the barrier layers of the semiconductor light emitting device 112 according to the second reference example. FIG. 7F shows the density of the misfit dislocations for the well layers of the semiconductor light emitting device 112 according to the second reference example. In the semiconductor light emitting device 112 according to the second reference example, the thickness of the barrier layer 31 is 5.0 nm; and the thickness of the well layer 32 is 2.0 nm. The semiconductor light emitting device 112 is manufactured by the manufacturing method described above in which the film thickness of the barrier layer 31 and the film thickness of the well layer 32 are modified. Otherwise, the manufacturing method is similar to the manufacturing method described above.

In either of the semiconductor light emitting devices 111 and 112 as shown in FIG. 7C and FIG. 7E, the misfit dislocations are less than $2×10^{12}/cm^2$ for all of the barrier layers BL(1) to BL(9). In the semiconductor light emitting devices 111 and 112, the misfit dislocations do not appear to be concentrated in a designated barrier layer as in the semiconductor light emitting device 110.

In the configuration of the light emitting unit 30 of the semiconductor light emitting device 110, the thickness of the well layer 32 is thicker than the thickness of the barrier layer 31. By such a configuration of the light emitting unit 30, the lattice of the well layer 32 which has a high In composition applies tensile strain to the lattice of the barrier layer 31 which has a low In composition (or in which In does not exist); and the misfit dislocations are generated concentratively in the barrier layers 31 that are designated (the designated barrier layers, i.e., the barrier layer BL(k)) which have spacing of about the critical film thickness.

Here, the integrated intensity of the light emission of the semiconductor light emitting devices 110, 111, and 112 measured using a photometric sphere will be described. An integrated intensity P110 of the light emission of the semiconductor light emitting device 110 is higher than integrated intensities P111 and P112 of the light emission of the semiconductor light emitting devices 111 and 112. The relative value of the integrated intensity P110 is about 1.22 when the integrated intensity P112 is taken to be 1. The relative value of the integrated intensity P111 is about 1.01 when the integrated intensity P112 is taken to be 1.

FIG. 8A to FIG. 8D are schematic views illustrating light emitting units.

FIG. 8A to FIG. 8D schematically show TEM images of the light emitting units.

Figure 8A:
FIG. 8A to FIG. 8D are schematic views illustrating light emitting units.

FIG. 8A shows a light emitting unit 30A including the multiple barrier layers 31 stacked alternately with the multiple well layers 32. The light emitting unit 30A is formed on Si (not shown). In the light emitting unit 30A, the thickness of the barrier layer 31 is 3 nm; and the thickness of the well layer 32 is 3.5 nm.

Figure 8B:
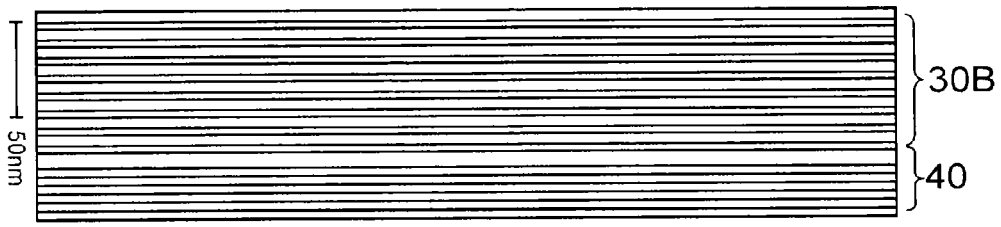

FIG. 8B shows a light emitting unit 30B including the multiple barrier layers 31 stacked alternately with the multiple well layers 32. The light emitting unit 30B is formed on Si (not shown). In the light emitting unit 30B, the thickness of the barrier layer 31 is 5 nm; and the thickness of the well layer 32 is 2.0 nm.

Figure 8C:
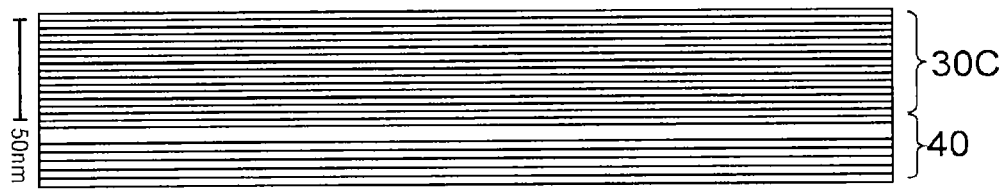

FIG. 8C shows a light emitting unit 30C including the multiple barrier layers 31 stacked alternately with the multiple well layers 32. The light emitting unit 30C is formed on sapphire (not shown). In the light emitting unit 30C, the thickness of the barrier layer 31 is 3 nm; and the thickness of the well layer 32 is 3.5 nm.

Figure 8D:

FIG. 8D shows a light emitting unit 30D including the multiple barrier layers 31 stacked alternately with the multiple well layers 32. The light emitting unit 30D is formed on sapphire (not shown). In the light emitting unit 30D, the thickness of the barrier layer 31 is 5 nm; and the thickness of the well layer 32 is 2.0 nm.

In the case where the thickness of the well layer 32 is thicker than the thickness of the barrier layer 31, as shown in FIG. 8A, the crystallinity of the light emitting unit 30A formed on Si is maintained sufficiently. On the other hand, as shown in FIG. 8C, the crystallinity of the light emitting unit 30C formed on sapphire is not maintained sufficiently.

In the case where the thickness of the well layer 32 is thinner than the thickness of the barrier layer 31, as shown in FIG. 8B and FIG. 8D, sufficient crystallinity is maintained for both the light emitting unit 30B formed on Si and the light emitting unit 30D formed on sapphire.

In the semiconductor light emitting device 110 according to the embodiment, the designated barrier layer in which the misfit dislocations are concentrated is provided in the light emitting unit 30 (30A) by setting the thickness of the well layer 32 to be thicker than the thickness of the barrier layer 31. Accordingly, in the semiconductor light emitting device 110, it is desirable for the light emitting unit 30 (30A) to be formed on Si.

In the case where the light emitting unit 30 (30A and 30B) is formed on Si, the barrier layer 31 is subjected to compressive stress. On the other hand, in the case where the light emitting unit 30 (30C and 30D) is formed on sapphire, the barrier layer 31 is subjected to tensile stress. The stress of the barrier layer 31 is determined by measuring the lattice constant of the crystal by XRD (X-ray Diffraction), Raman spectroscopy, etc.

As an example, for the GaN (the barrier layer 31) of the light emitting unit 30 formed on Si, the lattice constant of the a-axis is 3.193 angstroms (Å); and the lattice constant of the c-axis is 5182 Å. For the GaN (the barrier layer 31) of the light emitting unit 30 formed on sapphire, the lattice constant of the a-axis is 3.182 Å; and the lattice constant of the c-axis is 5185 Å.

Thus, the designated barrier layer is provided in the light emitting unit 30 by forming the light emitting unit 30 on Si such that the thickness of the well layer 32 is thicker than the thickness of the barrier layer 31. Thereby, the luminous efficiency of the semiconductor light emitting device 110 is higher than in the case where the designated barrier layer is not provided in the light emitting unit 30.

According to the embodiments, a highly efficient semiconductor light emitting device and a method for manufacturing the semiconductor light emitting device can be provided.

In the specification, "nitride semiconductor" includes all compositions of semiconductors of the chemical formula $B_x In_y Al_z Ga_{1-x-y-z} N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes Group V elements other than N (nitrogen) in the chemical formula recited above, various elements added to control various properties such as the conductivity type and the like, and various elements included unintentionally.

Hereinabove, embodiments of the invention are described with reference to specific examples. However, the invention is not limited to these specific examples. For example, one skilled in the art may similarly practice the invention by appropriately selecting specific configurations of components included in the semiconductor light emitting device such as the first semiconductor layer, the second semiconductor layer, the light emitting unit, the well layer, the barrier layer, the first electrode, the second electrode, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor light emitting devices and methods for manufacturing semiconductor light emitting devices practicable by an appropriate design modification by one skilled in the art based on the semiconductor light emitting devices and the methods for manufacturing semiconductor light emitting devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
a first semiconductor layer including a nitride semiconductor, the first semiconductor layer being of an n-type;
a second semiconductor layer including a nitride semiconductor, the second semiconductor layer being of a p-type; and
a light emitting unit provided between the first semiconductor layer and the second semiconductor layer, the light emitting unit including a plurality of barrier layers and a plurality of well layers stacked alternately with the barrier layers,
the barrier layers including:
a p-side barrier layer, the p-side barrier layer being second most proximal to the second semiconductor layer among the barrier layers;
an n-side barrier layer provided between the p-side barrier layer and the first semiconductor layer; and
a first intermediate barrier layer provided between the n-side barrier layer and the p-side barrier layer,
the well layers including:
a p-side well layer provided between the p-side barrier layer and the second semiconductor layer, the p-side well layer being in contact with the p-side barrier layer;
an n-side well layer provided between the n-side barrier layer and the first intermediate barrier layer, the n-side well layer being in contact with the n-side barrier layer; and
a first intermediate well layer provided between the first intermediate barrier layer and the p-side barrier layer, the first intermediate well layer being in contact with the first intermediate barrier layer,
a first density of first misfit dislocations being higher than a second density of second misfit dislocations, the first misfit dislocations being included in the first intermediate barrier layer and in an interface between the first intermediate barrier layer and the first intermediate well layer, the second misfit dislocations being included in the p-side barrier layer and in an interface between the p-side barrier layer and the p-side well layer.

2. The device according to claim 1, wherein at least one of the barrier layers is subjected to compressive stress.

3. The device according to claim 1, wherein the first density is not less than 1.5 times the second density.

4. The device according to claim 1, wherein the first density is not less than $5\times10^{12}/cm^2$.

5. The device according to claim 1, wherein the first density is not less than $7\times10^{12}/cm^2$.

6. The device according to claim 1, wherein the barrier layers further includes a second intermediate barrier layer provided between the first intermediate barrier layer and the p-side barrier layer, the well layers further include a second intermediate well layer provided between the second intermediate barrier layer and the p-side barrier layer, the second intermediate barrier layer being in contact with the second intermediate barrier layer, and a third density of third misfit dislocations is higher than the second density, the third misfit dislocations are included in the second intermediate barrier layer and in an interface between the second intermediate barrier layer and the second intermediate well layer.

7. The device according to claim 1, wherein a thickness of each of the well layers is thicker than a thickness of each of the barrier layers.

8. The device according to claim 1, wherein bandgap energy of each of the well layers is less than bandgap energy of each of the barrier layers.

9. The device according to claim 1, wherein a thickness of at least one of the well layers is not less than 2 nanometers and not more than 6 nanometers.

10. The device according to claim 1, wherein a thickness of at least one of the barrier layers is not less than 2 nanometers and not more than 10 nanometers.

11. The device according to claim 1, wherein at least one of the barrier layers includes GaN.

12. The device according to claim 1, wherein at least one of the well layers includes $In_wGa_{1-w}N$ ($0<w<1$).

13. The device according to claim 1, wherein the light emitting unit is configured to emit light, and a peak wavelength of the light is not less than 370 nanometers and not more than 650 nanometers.

14. The device according to claim 1, wherein the first intermediate barrier layer includes at least one selected from indium, magnesium, and silicon.

15. The device according to claim 1, wherein the first intermediate barrier layer includes indium.

16. The device according to claim 1, wherein at least one of the barrier layers is subjected to tensile stress.

17. A method for manufacturing a semiconductor light emitting device, comprising:

forming a first semiconductor layer including a nitride semiconductor, the first semiconductor layer being of an n-type;

forming a light emitting unit including a plurality of well layers and a plurality of barrier layers on the first semiconductor layer by alternately stacking the well layers and the barrier layers; and forming a second semiconductor layer on the light emitting unit, the second semiconductor layer including a nitride semiconductor and being of a p-type, the forming of the light emitting unit including:

forming an n-side barrier layer on the first semiconductor layer, the n-side barrier layer being included in the plurality of barrier layers;

forming an n-side well layer on the n-side barrier layer, the n-side well layer being included in the well layers and being in contact with the n-side barrier layer;

forming a first intermediate barrier layer on the n-side well layer, the first intermediate barrier layer being included in the barrier layers;

forming a first intermediate well layer on the first intermediate barrier layer, the first intermediate well layer being included in the well layers and being in contact with the first intermediate barrier layer;

forming a p-side barrier layer on the first intermediate well layer, the p-side barrier layer being included in the barrier layers; and forming a p-side well layer on the p-side barrier layer, the p-side well layer being included in the well layers and being in contact with the p-side barrier layer, a first density of first misfit dislocations being higher than a second density of second misfit dislocations, the first misfit dislocations being included in the first intermediate barrier layer and in an interface between the first intermediate barrier layer and the first intermediate well layer, the second misfit dislocations being included in the p-side barrier layer and in an interface between the p-side barrier layer and the p-side well layer.

18. The method according to claim 17, wherein the forming of the light emitting unit includes forming a thickness of each of the well layers to be thicker than a thickness of each of the barrier layers.

19. The method according to claim 17, wherein the forming of the first semiconductor layer includes forming the first semiconductor layer on a substrate including silicon.

20. The method according to claim 17, where the first intermediate barrier layer includes at least one selected from indium, magnesium, and silicon.

* * * * *